United States Patent
Wistrom et al.

(10) Patent No.: US 9,964,847 B2
(45) Date of Patent: May 8, 2018

(54) MASK SUBSTRATE STRUCTURE

(71) Applicant: GLOBALFOUNDRIES INC., Grand Cayman (KY)

(72) Inventors: Richard Wistrom, Essex Junction, VT (US); Mark S. Lawliss, Essex Junction, VT (US); A. Gary Reid, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 8 days.

(21) Appl. No.: 15/187,126

(22) Filed: Jun. 20, 2016

(65) Prior Publication Data

US 2017/0365471 A1    Dec. 21, 2017

(51) Int. Cl.
| | |
|---|---|
| *G03F 1/26* | (2012.01) |
| *G03F 1/36* | (2012.01) |
| *G03F 1/38* | (2012.01) |
| *G03F 1/54* | (2012.01) |
| *G03F 1/80* | (2012.01) |

(52) U.S. Cl.
CPC .......... *G03F 1/26* (2013.01); *G03F 1/36* (2013.01); *G03F 1/38* (2013.01); *G03F 1/54* (2013.01); *G03F 1/80* (2013.01)

(58) Field of Classification Search
CPC ..... G03F 1/26; G03F 1/54; G03F 1/36; G03F 1/38
USPC .......................................................... 430/5
See application file for complete search history.

(56) References Cited

U.S. PATENT DOCUMENTS

| | | | |
|---|---|---|---|
| 9,075,319 B2 * | 7/2015 | Hashimoto | ............... G03F 1/46 |
| 9,625,806 B2 | 4/2017 | Nozawa et al. | |
| 2016/0099324 A1 | 4/2016 | Chang et al. | |

FOREIGN PATENT DOCUMENTS

| | | |
|---|---|---|
| TW | 201435477 | 9/2014 |
| WO | 2014112409 | 7/2017 |

OTHER PUBLICATIONS

Kindt, et al. "Damage Mechanisms and Process Optimization for Photomasks with Sub-Resolution Assist Features", Proc. SPIE 7122, Photomask Technology 2008, 71220I (Oct. 17, 2008), 11 pages.
Helbig, et al."Impact of MegaSonic process conditions on PRE and Sub-resolution assist feature damage", SPIE 7122, Photomask Technology 2008, 712210 (Oct. 17, 2008), 10 pages.
Taiwanese Office Action in related TW Application No. 105126728 dated Jul. 31, 2017, 12 pages.
Taiwanese Notice of Allowance in related TW Application No. 105126728 dated Jan. 19, 2018, 3 pages.

* cited by examiner

*Primary Examiner* — Christopher G Young
(74) *Attorney, Agent, or Firm* — Michael Le Strange; Andrew M. Calderon; Roberts Mlotkowski Safran Cole & Calderon, P.C.

(57) ABSTRACT

The present disclosure relates to lithographic masks and, more particularly, to a lithographic mask substrate structure and methods of manufacture. The mask includes a sub-resolution assist feature (SRAF) formed on a quartz substrate and composed of a patterned transition film and absorber layer.

20 Claims, 1 Drawing Sheet

MASK SUBSTRATE STRUCTURE

FIELD OF THE INVENTION

The present disclosure relates to lithographic masks and, more particularly, to a lithographic mask substrate structure and methods of manufacture.

BACKGROUND

Advanced technology masks require very small lines called sub-resolution assist features (SRAF). These features are too small to print on wafers, but they influence mask optics to improve the image on wafers. Because they are so small, SRAF often break off during mask processing. The breakage happens in the quartz mask blank near the quartz/absorber layer interface due to the mask substrate design, which requires the quartz to be etched to achieve the needed optical properties of the absorber layer. This, in turn, limits linewidth (e.g., narrow lines break more easily), reduces overall yield and limits cleaning ability (e.g., requires gentle cleans so as to not damage the SRAFs). This problem is expected to grow worse as mask dimensions decrease with advancing technology.

SUMMARY

In an aspect of the disclosure, a mask comprises a sub-resolution assist feature (SRAF) formed on a quartz substrate and composed of a patterned transition film and absorber layer.

In an aspect of the disclosure, a mask comprises: an optically transparent substrate; and a patterned absorber layer and transition layer which includes sub-resolution assist features formed on a surface of the optically transparent substrate. The sub-resolution assist features comprises a transition film and an absorber layer.

In an aspect of the disclosure, a method of forming a mask comprises: forming an optical transition film on a quartz substrate; forming an absorber layer on the optical transition film; forming a hardmask on the absorber layer; and forming features including sub-resolution assist features by patterning of the optical transition film and the absorber layer, and removal of the hardmask over the patterned optical transition film and the absorber layer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to lithographic masks and, more particularly, to a lithographic mask substrate structure and methods of manufacture. More specifically, the present disclosure provides a mask substrate structure design for robust sub-resolution assist features (SRAF).

In embodiments, a transition (buffer) layer is provided between a mask substrate (e.g., quartz) and an absorber film (e.g., MoSiN) to eliminate fragile corners that occur in the mask substrate at the base of the SRAF during manufacturing processes. More specifically, in embodiments, the transition layer eliminates the need to etch into the mask substrate, e.g., quartz, when forming the SRAF, thus preventing cracking or other breakage at the interface of the mask substrate and SRAF during subsequent fabrication processes, e.g., cleaning processes.

The lithographic mask substrate structure of the present disclosure can be manufactured in a number of ways using a number of different tools. In general, though, the methodologies and tools are used to form structures with dimensions in the micrometer and nanometer scale. The methodologies, i.e., technologies, employed to manufacture the mask substrate structures of the present disclosure have been adopted from integrated circuit (IC) technology. For example, the lithographic mask substrate structure is used to transfer the integrated circuit design onto a wafer. In particular, the fabrication of the lithographic mask substrate structure uses three basic building blocks: (i) deposition of thin films of material on a substrate, (ii) applying a patterned mask on top of the films by photolithographic imaging, and (iii) etching the films selectively to the substrate.

Figure 1:
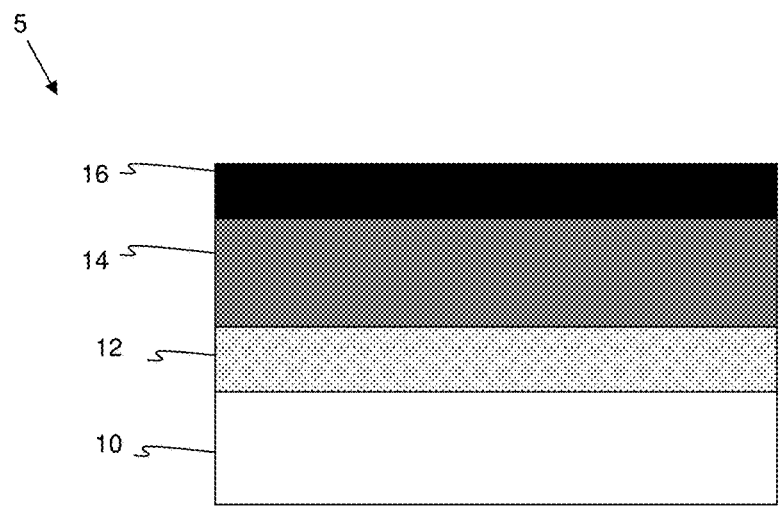
FIG. 1 shows a stacked structure and respective fabrication processes in accordance with aspects of the present disclosure.

FIG. 1 shows a stacked structure and respective fabrication processes in accordance with aspects of the present disclosure. More specifically, the stacked structure 5 includes a transition film 12 formed on an optically transparent (e.g., quartz) substrate 10. In embodiments, the transition film 12 is an optically transparent film. For example, the transition film 12 can be a single composition of SiN or $SiO_2$ for increased interface strength or a gradient composition of SiN and $SiO_2$, although other optically transparent films also contemplated for use herein. In embodiments, the optical properties of the substrate mask are designed so that the appropriate contrast (e.g., transmission difference) between any clear and opaque mask features are maintained, as should be understood by those of skill in the art.

In embodiments, the transition film 12 can have a gradient composition between a bottom layer of $SiO_2$ and a top layer of SiN, for example. In this way, the bottom layer of $SiO_2$ and the quartz substrate 10 can have a seamless transition and, similarly, the top layer can transition easily into the absorber layer 14 formed on the transition film 12.

In embodiments, the transition film 12 can be deposited using a conventional sputtering technique such as, e.g., a physical vapor deposition (PVD) process. In embodiments, the thickness of the transition film 12 should be thick enough to achieve the needed optical properties of the absorber layer 14, e.g., achieve a 180° shift for phase-shift MoSiN, without the need to etch into the quartz 10. For example, the transition film 12 can be deposited to a thickness of about 20 nm or less; although other dimensions are also contemplated herein.

Still referring to FIG. 1, the absorber layer 14 is deposited on the transition film 12 using conventional deposition processes, e.g., chemical vapor deposition (CVD) or sputtering, to a thickness of about 60 nm or more. The transition film 12 and the absorber layer 14 should preferably be deposited without breaking the vacuum between the layers to avoid a weakened interface. In embodiments, the absorber layer 14 can be, for example, a phase-shift MoSiN film, a phase-shift SiN film, an opaque MoSiN on glass film (OMOG) or TaN. A hardmask 16 is formed on the absorber layer 14. In embodiments, the hardmask 16 can be, for example, Chromium (Cr).

Table 1, below, shows different combinations of absorber layers and transition films, used with a quartz substrate as contemplated to be used with the present disclosure.

TABLE 1

| Substrate | Transition | Absorber |
| --- | --- | --- |
| Quartz | SiO2 | MoSiN |
| Quartz | Silicon nitride | MoSiN |
| Quartz | SiO2 | OMOG |
| Quartz | Silicon nitride | OMOG |
| Quartz | SiO2 | TaN |
| Quartz | Silicon nitride | TaN |

Figure 2:
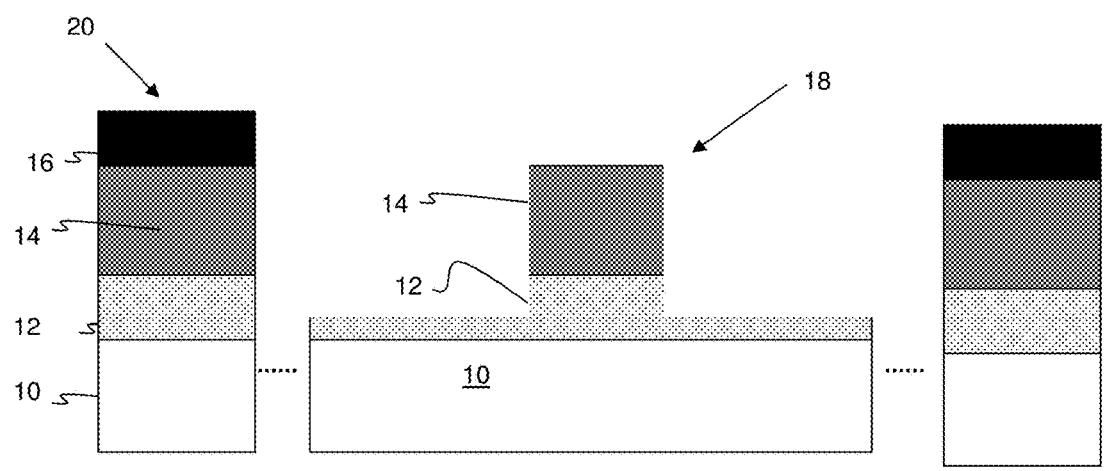
FIG. 2 shows a representative mask structure formed from the stacked structure of FIG. 1 and respective fabrication processes in accordance with aspects of the present disclosure.

FIG. 2 shows a representative mask structure formed from the stacked structure of FIG. 1 and respective fabrication processes in accordance with aspects of the present disclosure. In embodiments, the mask structure includes a sub-resolution assist feature (SRAF) 18 and a frame 20 both of which are formed from the stacked structure shown in FIG. 1. As shown in FIG. 2, the sub-resolution assist feature 18 includes the transition film 12 and the absorber layer 14; whereas, the frame 20 includes the transition film 12, the absorber layer 14 and the hardmask 16.

In embodiments, the sub-resolution assist feature 18 is formed by etching processes which extend (e.g., etched) into the transition film 12; that is, the etching processes do not etch into the quartz 10. Instead, by using the transition film 12 it is possible to achieve the needed optical properties, e.g., shift the phase-shift MoSiN film 14 to 180°, without the need to etch into the quartz 10 (compared to a conventional mask). Accordingly, as should be understood by those of skill in the art, as there is no etching into the quartz 10, formation of weak spots in the quartz 10, i.e., at a corner of the quartz, will be eliminated.

By way of more specific discussion, the representative mask structure of FIG. 2 can be formed by conventional lithography and etching processes. For example, a first resist is formed over the hardmask 16 and is exposed to energy (e.g., electron beam) to form a pattern (e.g., opening). An etching process is provided through the opening to remove portions of the hardmask 16, the absorber layer 14 and transition film 12, leaving the sub-resolution assist feature 18 (with hardmask 16 on a top surface). As shown in FIG. 2, the etching process will stop in the transition film 12 (without etching into the quartz 10). In embodiments, the etching is a dry etching processes, e.g., reactive ion etching (RIE). The resist is then removed by a resist strip or oxygen ashing process.

Still referring to FIG. 2, a second resist is formed on the structure and is exposed to energy (e.g., electron beam or laser beam) to form a pattern (e.g., opening) corresponding to the entire chip area, which includes the sub-resolution assist feature 18. The hardmask 16 on the top surface of the sub-resolution assist feature 18 will then be subjected to an etching process, e.g., RIE, to remove the hardmask therefrom. In embodiments, the resist will protect the hardmask 16 which forms part of the frame 20 during the etching process. In this way, for example, the frame 20 will be composed of the transition film 12, the absorber layer 14 and the hardmask 16 (thus will be optically opaque); whereas the sub-resolution assist feature 18 will be formed from the transition film 12 and the absorber layer 14, with the underlying quartz 10 being protected from any etching processes.

Accordingly, the sub-resolution assist feature 18 is formed on a top surface of the optically transparent substrate 10, e.g., quartz. The sub-resolution assist feature 18 comprises the patterned transition film 12 and absorber layer 14. Advantageously, the transition film 12 will prevent formation of weak spots in the quartz 10, i.e., at a corner of the quartz formed due to an etching process. In this way, the interface which tends to be the most fragile (e.g., attenuator and quartz transition) is spread out over the entire substrate surface thus preventing high stress concentrations at the sub-resolution assist feature 18.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A mask comprising a sub-resolution assist feature (SRAF) formed on a quartz substrate and composed of a patterned transition film and patterned absorber layer over a surface of the quartz substrate.

2. The mask of claim 1, wherein the patterned transition film is an optically transparent film which includes a thickness of material that remains directly on and protects the surface of the quartz substrate during an etching process that forms the patterned transition film and the patterned absorber layer.

3. The mask of claim 1, wherein the patterned transition film is $SiO_2$.

4. The mask of claim 1, wherein the patterned transition film is SiN.

5. The mask of claim 1, wherein the patterned transition film is gradient of $SiO_2$ and SiN.

6. The mask of claim 5, wherein the $SiO_2$ is a bottom layer transitioning from the quartz substrate and the SiN is a top layer transitioning into the absorber layer.

7. The mask of claim 1, wherein the absorber layer is phase-shift MoSiN film, an opaque MoSiN on glass film (OMOG) or TaN.

8. The mask of claim 1, further comprising a frame adjacent to the SRAF, the frame comprising the transition film, the absorber layer and a hardmask material on the absorber layer.

9. The mask of claim 1, wherein the patterned transition film has a thickness to achieve a phase shift of the absorber layer.

10. The mask of claim 9, wherein the patterned transition film has a thickness of about 20 nm or less.

11. The structure of claim 1, wherein, after the etching process, the patterned transition film remains on a same portion of the surface of the quartz substrate as originally deposited.

12. A mask comprising:
an optically transparent substrate; and
a patterned absorber layer and an optically transparent transition film which includes sub-resolution assist feature formed on a surface of the optically transparent substrate, the sub-resolution assist feature comprising the optically transparent transition film and an absorber layer.

13. The mask of claim 12, wherein the transition film is $SiO_2$.

14. The mask of claim 12, wherein the transition film is SiN.

15. The mask of claim 12, wherein:
the transition film is gradient of $SiO_2$ and SiN,
the $SiO_2$ is a bottom layer transitioning from the optically transparent substrate, and
the SiN is a top layer transitioning into the absorber layer.

16. The mask of claim 12, wherein the absorber layer is phase-shift MoSiN film, an opaque MoSiN on glass film (OMOG) or TaN.

17. The mask of claim 12, wherein the optically transparent substrate is quartz substrate.

18. The mask of claim 12, wherein the transition film has a thickness to achieve a phase shift of the absorber layer.

19. The structure of claim 12, wherein, after the etching process, the optical transparent transition film remains directly on a same surface of the optically transparent substrate as originally deposited.

20. A method of forming a mask, comprising:
forming an optical transparent transition film directly on a quartz substrate;
forming an absorber layer on the optical transparent transition film;
forming a hardmask on the absorber layer; and
forming features including a sub-resolution assist feature by patterning of the optical transparent transition film and the absorber layer, with the optical transparent transition film protecting the quartz substrate from being etched during the forming of the sub-resolution assist feature; and
removing the hardmask over the patterned optical transparent transition film and the absorber layer.

* * * * *